United States Patent
Raring

(10) Patent No.: US 8,254,425 B1
(45) Date of Patent: Aug. 28, 2012

(54) OPTICAL DEVICE STRUCTURE USING GAN SUBSTRATES AND GROWTH STRUCTURES FOR LASER APPLICATIONS

(75) Inventor: James W. Raring, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 35 days.

(21) Appl. No.: 12/762,269

(22) Filed: Apr. 16, 2010

Related U.S. Application Data

(60) Provisional application No. 61/170,550, filed on Apr. 17, 2009, provisional application No. 61/170,553, filed on Apr. 17, 2009, provisional application No. 61/177,218, filed on May 11, 2009, provisional application No. 61/243,502, filed on Sep. 17, 2009.

(51) Int. Cl.
*H01S 5/00* (2006.01)
(52) U.S. Cl. .................... 372/46.01; 372/45.01
(58) Field of Classification Search ............. 372/46.01, 372/45.01
See application file for complete search history.

(56) References Cited

U.S. PATENT DOCUMENTS

| | | |
|---|---|---|
| 4,341,592 A | 7/1982 | Shortes et al. |
| 4,860,687 A | 8/1989 | Frijlink |
| 5,334,277 A | 8/1994 | Nakamura |
| 5,366,953 A | 11/1994 | Char et al. |
| 5,527,417 A | 6/1996 | Lida et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 6,069,394 A * | 5/2000 | Hashimoto et al. ........... 257/466 |
| 6,147,953 A | 11/2000 | Duncan |
| 6,153,010 A | 11/2000 | Kiyoku et al. |
| 6,379,985 B1 | 4/2002 | Cervantes et al. |
| 6,451,157 B1 | 9/2002 | Hubacek |
| 6,586,762 B2 | 7/2003 | Kozaki |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,053,413 B2 | 5/2006 | D'Evelyn et al. |
| 7,063,741 B2 | 6/2006 | D'Evelyn |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |

(Continued)

FOREIGN PATENT DOCUMENTS

JP     2007-173467 A     7/2007

OTHER PUBLICATIONS

U.S. Appl. No. 12/942,817, filed Nov. 9, 2010, Pfister et al.

(Continued)

*Primary Examiner* — Patrick Stafford
(74) *Attorney, Agent, or Firm* — Kilpatrick Townsend & Stockton LLP

(57) ABSTRACT

An optical device having a structured active region configured for selected wavelengths of light emissions.

18 Claims, 14 Drawing Sheets

U.S. PATENT DOCUMENTS

| | | | |
|---|---|---|---|
| 7,338,828 | B2 | 3/2008 | Imer et al. |
| 7,390,359 | B2 | 6/2008 | Miyanaga et al. |
| 7,470,555 | B2 | 12/2008 | Matsumura |
| 7,489,441 | B2 | 2/2009 | Scheible et al. |
| 7,555,025 | B2 | 6/2009 | Yoshida |
| 7,727,332 | B2 | 6/2010 | Habel et al. |
| 7,749,326 | B2 | 7/2010 | Kim et al. |
| 7,806,078 | B2 | 10/2010 | Yoshida |
| 7,968,864 | B2 | 6/2011 | Akita et al. |
| 8,017,932 | B2 | 9/2011 | Okamoto et al. |
| 2002/0050488 | A1 | 5/2002 | Nikitin et al. |
| 2002/0085603 | A1 | 7/2002 | Okumura |
| 2003/0000453 | A1 | 1/2003 | Unno et al. |
| 2003/0001238 | A1 | 1/2003 | Ban |
| 2003/0012243 | A1 | 1/2003 | Okumura |
| 2003/0020087 | A1 | 1/2003 | Goto et al. |
| 2003/0140846 | A1 | 7/2003 | Biwa et al. |
| 2003/0216011 | A1* | 11/2003 | Nakamura et al. ............ 438/478 |
| 2004/0025787 | A1 | 2/2004 | Selbrede et al. |
| 2004/0060518 | A1 | 4/2004 | Nakamura et al. |
| 2004/0151222 | A1 | 8/2004 | Sekine |
| 2004/0196877 | A1 | 10/2004 | Kawakami et al. |
| 2005/0040384 | A1 | 2/2005 | Tanaka et al. |
| 2005/0072986 | A1 | 4/2005 | Sasaoka |
| 2005/0168564 | A1 | 8/2005 | Kawaguchi et al. |
| 2005/0224826 | A1 | 10/2005 | Keuper et al. |
| 2005/0229855 | A1 | 10/2005 | Raaijmakers |
| 2006/0037529 | A1 | 2/2006 | D'Evelyn |
| 2006/0060131 | A1 | 3/2006 | Atanackovic |
| 2006/0078022 | A1 | 4/2006 | Kozaki et al. |
| 2006/0079082 | A1 | 4/2006 | Bruhns et al. |
| 2006/0086319 | A1 | 4/2006 | Kasai et al. |
| 2006/0118799 | A1 | 6/2006 | D'Evelyn et al. |
| 2006/0144334 | A1 | 7/2006 | Yim et al. |
| 2006/0189098 | A1 | 8/2006 | Edmond |
| 2006/0193359 | A1 | 8/2006 | Kuramoto |
| 2006/0216416 | A1 | 9/2006 | Sumakeris et al. |
| 2006/0256482 | A1 | 11/2006 | Araki et al. |
| 2006/0288928 | A1 | 12/2006 | Eom et al. |
| 2007/0110112 | A1 | 5/2007 | Sugiura |
| 2007/0217462 | A1* | 9/2007 | Yamasaki .................. 372/46.01 |
| 2008/0087919 | A1 | 4/2008 | Tysoe et al. |
| 2008/0092812 | A1 | 4/2008 | McDiarmid et al. |
| 2008/0095492 | A1 | 4/2008 | Son et al. |
| 2008/0124817 | A1 | 5/2008 | Bour et al. |
| 2008/0164578 | A1 | 7/2008 | Tanikella et al. |
| 2008/0173735 | A1 | 7/2008 | Mitrovic et al. |
| 2008/0191192 | A1 | 8/2008 | Feezle et al. |
| 2008/0191223 | A1 | 8/2008 | Nakamura et al. |
| 2008/0217745 | A1 | 9/2008 | Miyanaga et al. |
| 2008/0232416 | A1 | 9/2008 | Okamoto et al. |
| 2008/0285609 | A1 | 11/2008 | Ohta et al. |
| 2008/0291961 | A1* | 11/2008 | Kamikawa et al. ........ 372/49.01 |
| 2008/0303033 | A1 | 12/2008 | Brandes |
| 2008/0315179 | A1 | 12/2008 | Kim et al. |
| 2009/0058532 | A1* | 3/2009 | Kikkawa et al. .............. 330/295 |
| 2009/0078944 | A1 | 3/2009 | Kubota et al. |
| 2009/0081857 | A1 | 3/2009 | Hanser et al. |
| 2009/0141765 | A1 | 6/2009 | Kohda et al. |
| 2009/0159869 | A1 | 6/2009 | Ponce et al. |
| 2009/0229519 | A1 | 9/2009 | Saitoh |
| 2009/0250686 | A1 | 10/2009 | Sato et al. |
| 2009/0267100 | A1 | 10/2009 | Miyake et al. |
| 2009/0301387 | A1 | 12/2009 | D'Evelyn |
| 2009/0301388 | A1 | 12/2009 | D'Evelyn |
| 2009/0309110 | A1 | 12/2009 | Raring et al. |
| 2009/0309127 | A1 | 12/2009 | Raring et al. |
| 2009/0320744 | A1 | 12/2009 | D'Evelyn |
| 2010/0001300 | A1 | 1/2010 | Raring et al. |
| 2010/0003492 | A1 | 1/2010 | D'Evelyn |
| 2010/0006873 | A1 | 1/2010 | Raring et al. |
| 2010/0025656 | A1 | 2/2010 | Raring et al. |
| 2010/0031875 | A1 | 2/2010 | D'Evelyn |
| 2010/0096615 | A1 | 4/2010 | Okamoto et al. |
| 2010/0140745 | A1 | 6/2010 | Khan et al. |
| 2010/0151194 | A1 | 6/2010 | D'Evelyn |
| 2010/0295054 | A1 | 11/2010 | Okamoto et al. |
| 2010/0302464 | A1 | 12/2010 | Raring |
| 2010/0316075 | A1 | 12/2010 | Raring et al. |
| 2011/0056429 | A1 | 3/2011 | Raring et al. |
| 2011/0057167 | A1 | 3/2011 | Ueno et al. |
| 2011/0064100 | A1 | 3/2011 | Raring et al. |
| 2011/0064101 | A1 | 3/2011 | Raring et al. |
| 2011/0064102 | A1 | 3/2011 | Raring et al. |
| 2011/0103418 | A1 | 5/2011 | Hardy et al. |
| 2011/0180781 | A1 | 7/2011 | Raring et al. |
| 2011/0186874 | A1 | 8/2011 | Shum |
| 2011/0186887 | A1 | 8/2011 | Trottier et al. |
| 2011/0247556 | A1 | 10/2011 | Raring et al. |

OTHER PUBLICATIONS

U.S. Appl. No. 12/963,238, filed Sep. 20, 2010, Raring et al.
U.S. Appl. No. 12/880,803, filed Sep. 13, 2010, Raring et al.
U.S. Appl. No. 12/880,889, filed Sep. 13, 2010, Raring et al.
U.S. Appl. No. 12/749,466, filed Mar. 29, 2010, Raring et al.
U.S. Appl. No. 12/749,476, filed Mar. 29, 2010, Poblenz et al.
U.S. Appl. No. 12/727,148, filed Mar. 18, 2010, Raring.
U.S. Appl. No. 12/573,820, filed Oct. 5, 2009, Raring et al.
U.S. Appl. No. 12/502,382, filed Jul. 14, 2009, Raring et al.
U.S. Appl. No. 12/502,058, filed Jul. 13, 2009, Raring et al.
U.S. Appl. No. 12/497,289, filed Jul. 2, 2009, Raring et al.
Aoki et al., "InGaAs/InGaAsP MQW Electroabsorption Modulator Integrated with a DFB Laser Fabricated by Band-Gap Energy Control Selective Area MOCVD, 1993, "IEEE J Quantum Electronics, vol. 29, pp. 2088-2096.
Asano et al., "100-mW kink-Free Blue-Violet Laser Diodes with Low Aspect Ratio," 2003, IEEE Journal of Quantum Electronics, vol. 39, No. 1, pp. 135-140.
Bernardini et al., "Spontaneous Polarization and Piezoelectric Constants of III-V Nitrides," 1997, Physical Review B, vol. 56, No. 16, pp. 10024-10027.
Caneau et al., "Studies on Selective OMVPE of (Ga,In)/(As,P)," 1992, Journal of Crystal Growth, vol. 124, pp. 243-248.
Chen et al., "Growth and Optical Properties of Highly Uniform and Periodic InGaN Nanostructures," 2007, Advanced Materials, vol. 19, pp. 1707-1710.
D'Evelyn et al., "Bulk GaN Crystal Growth by the High-Pressure Ammonothermal Method," Journal of Crystal Growth, 2007, vol. 300, pp. 11-16.
Fujii et al., "Increase in the Extraction Efficiency of GaN-based Light-Emitting Diodes Via Surface Roughening," 2004, Applied Physics Letters, vol. 84, No. 6, pp. 855-857.
Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.
Gardner et al. "Blue-emitting InGaN-GaN double-heterostructure light-emitting diodes reaching maximum quantum efficiency above 200 A/ cm2", Applied Physics Letters 91, 243506 (2007).
hap ://techon.nikkeibp. co jp/english/NEWS_EN/20080122/146009.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.

Masui et al. "Electrical Characteristics of Nonpolar InGaN-Based Light-Emitting Diodes Evaluated at Low Temperature," Jpn. J. Appl. Phys. 46 pp. 7309-7310 (2007).

Michiue et al. "Recent development of nitride LEDs and LDs," Proceedings of SPIE, vol. 7216, 72161Z (2009).

Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.

Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.

Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.

Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.

Purvis, "Changing the Crystal Face of Gallium Nitride." The Advance Semiconductor Magazine, vol. 18, No. 8, Nov. 2005.

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-plane InGaN/GaN Laser Diodes," 2007, Journal of Japanese Applied Physics, vol. 46, No. 9, pp. 190-191.

Schmidt et al., "High Power and High External Efficiency m-plane InGaN Light Emitting Diodes," 2007, Japanese Journal of Applied Physics, vol. 46, No. 7, pp. L126-L128.

Shchekin et al., "High Performance Thin-film Flip-Chip InGaN-GaN Light-emitting Diodes," 2006, Applied Physics Letters, vol. 89, pp. 071109-071109-3.

Shen et al. "Auger recombination in InGaN measured by photoluminescence," Applied Physics Letters, 91, 141101 (2007).

Sizov et al., "500-nm Optical Gain Anisotropy of Semipolar (1122) InGaN Quantum Wells," 2009, Applied Physics Express, vol. 2, pp. 071001-1-071001-3.

Tomiya et. al. Dislocation related issues in the degradation of GaN-based laser diodes, IEEE Journal of Selected Topics in Quantum Electronics vol. 10, No. 6 (2004).

Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.

Uchida et al.,"Recent Progress in High-Power Blue-violet Lasers," 2003, IEEE Journal of Selected Topics in Quantum Electronics, vol. 9, No. 5, pp. 1252-1259.

Waltereit et al., "Nitride Semiconductors Free of Electrostatic Fields for Efficient White Light-emitting Diodes," 2000, Nature: International Weekly Journal of Science, vol. 406, pp. 865-868.

Wierer et al., "High-power AlGaInN Flip-chip Light-emitting Diodes," 2001, Applied Physics Letters, vol. 78, No. 22, pp. 3379-3381.

Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.

Yoshizumi et al. "Continuous-Wave operation of 520 nm Green InGaN-Based Laser Diodes on Semi-Polar {20-21} GaN Substrates," Applied Physics Express 2 (2009). -1310 1410.

Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

Office action for U.S. Appl. No. 12/573,820 (Oct. 11, 2011).
Office action for U.S. Appl. No. 12/749,466 (Feb. 3, 2012).
Office action for U.S. Appl. No. 13/046,565 (Feb. 2, 2012).
Office action for U.S. Appl. No. 13/046,565 (Nov. 7, 2011).
Office action for U.S. Appl. No. 12/484,924 (Oct. 31, 2011).
Office action for U.S. Appl. No. 12/497,289 (Feb. 2, 2012).
Office action for U.S. Appl. No. 12/759,273 (Nov. 21, 2011).
Office action for U.S. Appl. No. 12/762,271 (Dec. 23, 2011).
Office action for U.S. Appl. No. 12/778,718 (Nov. 25, 2011).
Notice of Allowance for U.S. Appl. No. 12/762,278 (Nov. 7, 2011).

Abare "Cleaved and Etched Facet Nitride Laser Diodes," IEEE Journal of Selected Topics in Quantum Electronics, vol. 4, No. 3, pp. 505-509 (May 1998).

Asif Khan "Cleaved cavity optically pumped InGaN-GaN laser grown on spinel substrates," Appl. Phys. Lett. 69 (16), pp. 2418-2420 (Oct. 14, 1996).

Lin et al."Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).

Okamoto et al. In "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).

Park, "Crystal orientation effects on electronic properties of wurtzite InGaN/GaN quantum wells,",Journal of Applied Physics vol. 91, No. 12, pp. 9904-9908 (Jun. 2002).

Romanov "Strain-induced polarization in wurtzite III-nitride semipolar layers," Journal of Applied Physics 100, pp. 023522-1 through 023522-10 (Jul. 25, 2006).

Schoedl "Facet degradation of GaN heterostructure laser diodes," Journal of Applied Physics vol. 97, issue 12, pp. 123102-1 to 123102-8 (2005).

* cited by examiner

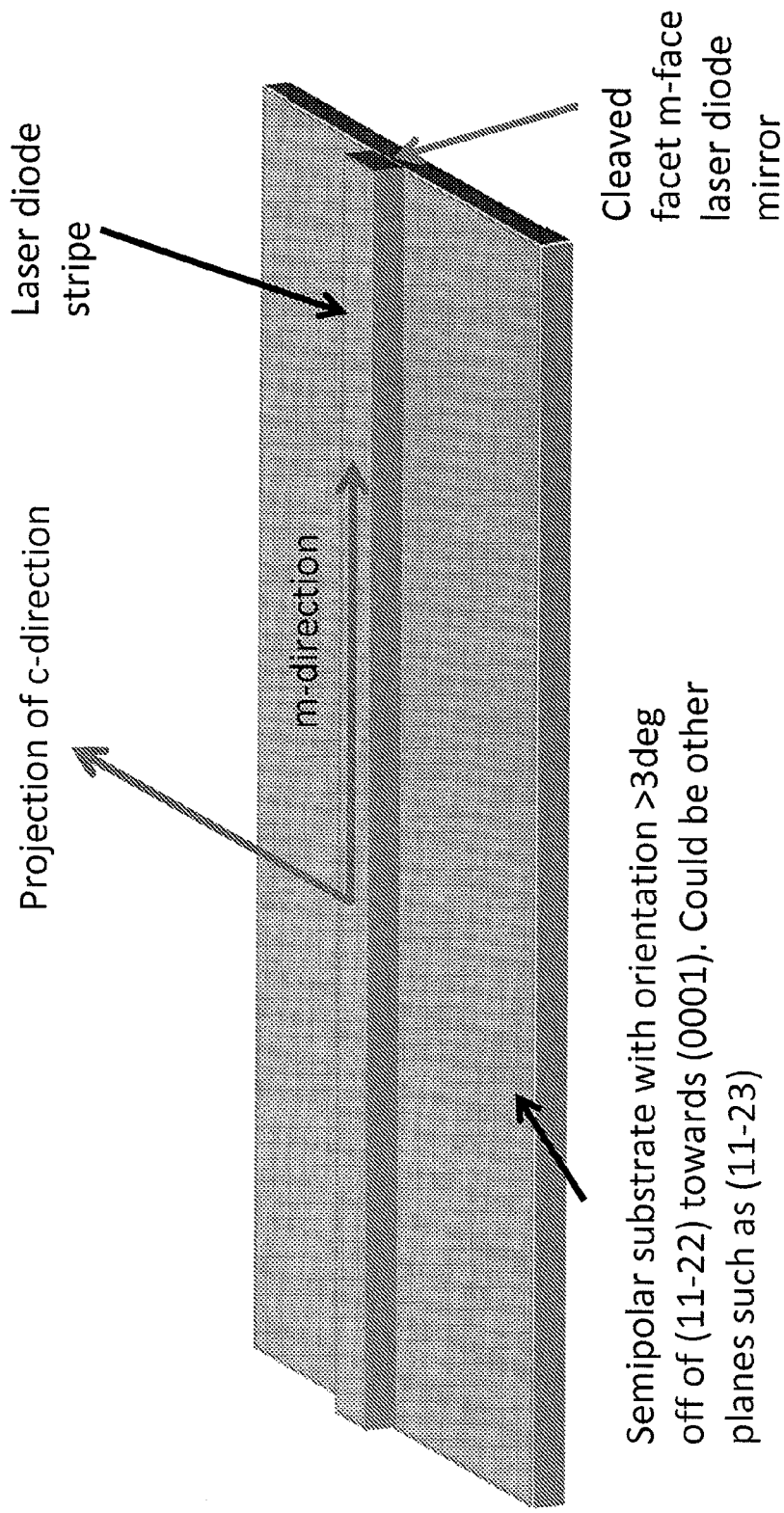
Figure 1A: m-direction laser diode on semipolar substrate with cleaved mirror

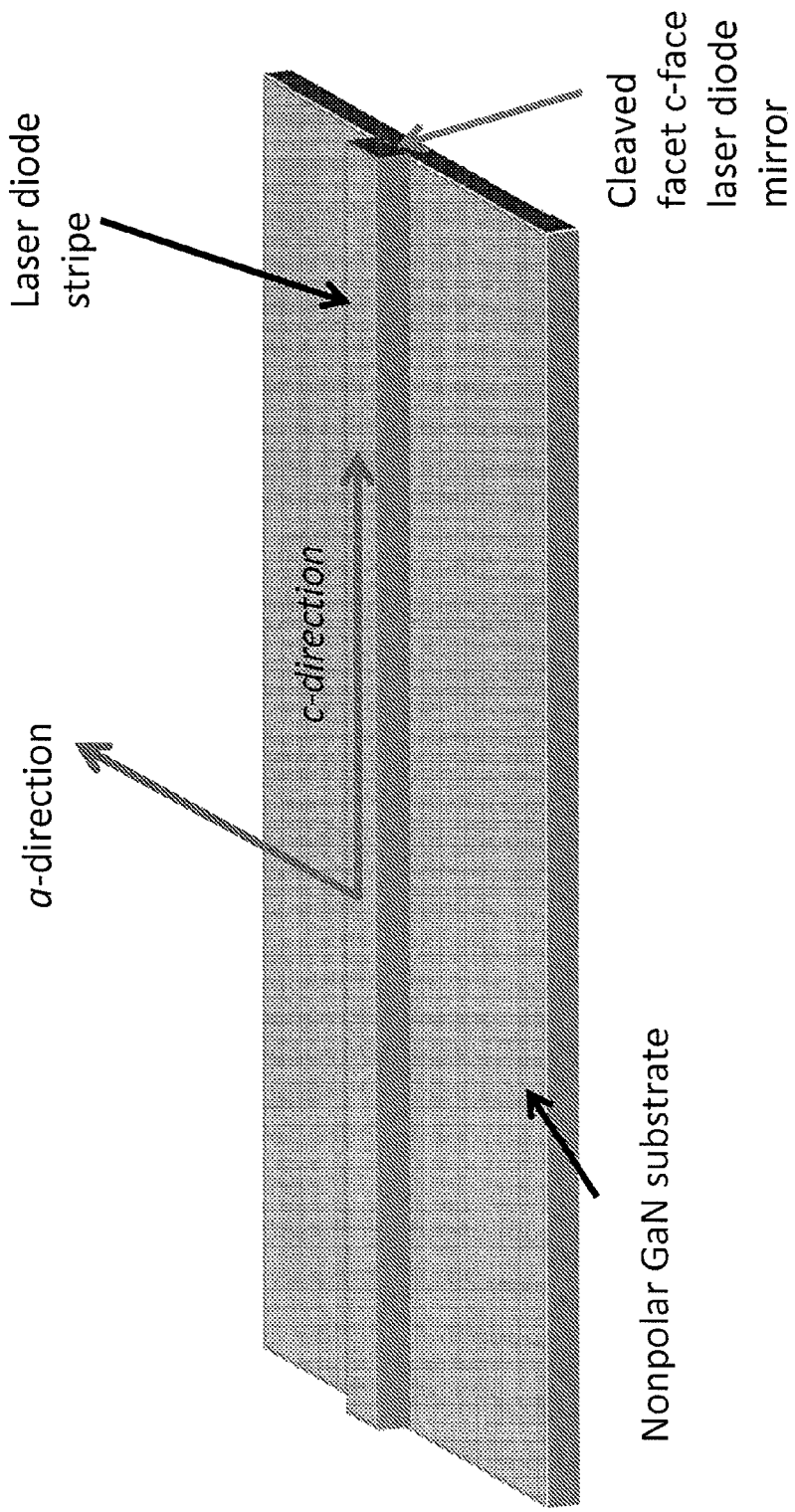
Figure 1B: c-direction laser diode on nonpolar substrate with cleaved mirror

Figure 3: 485nm LD Preferred Design
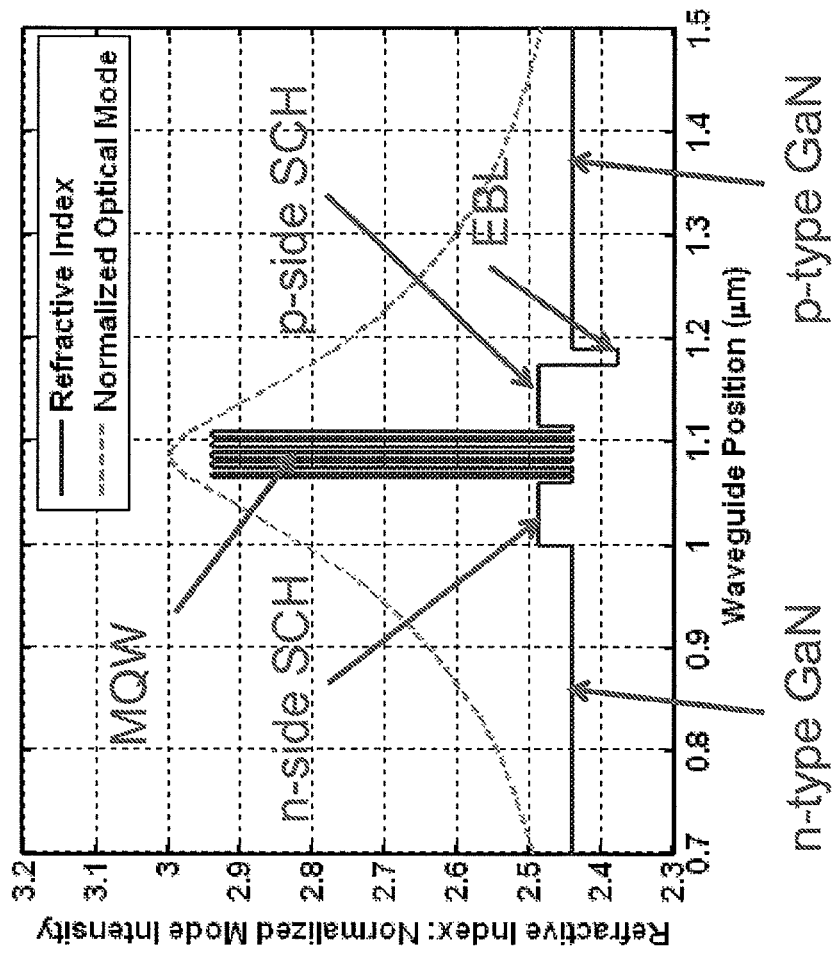
- Index and optical mode profile
- Preferred embodiment example
  - MQW
    - 5 X 5nm InGaN quantum wells
    - 6 X 5nm GaN barriers
  - 60nm 4% InGaN n-side SCH
  - 60nm 4% InGaN p-side SCH
  - 10nm 20% AlGaN electron blocking layer (EBL) between MQW and p-side SCH

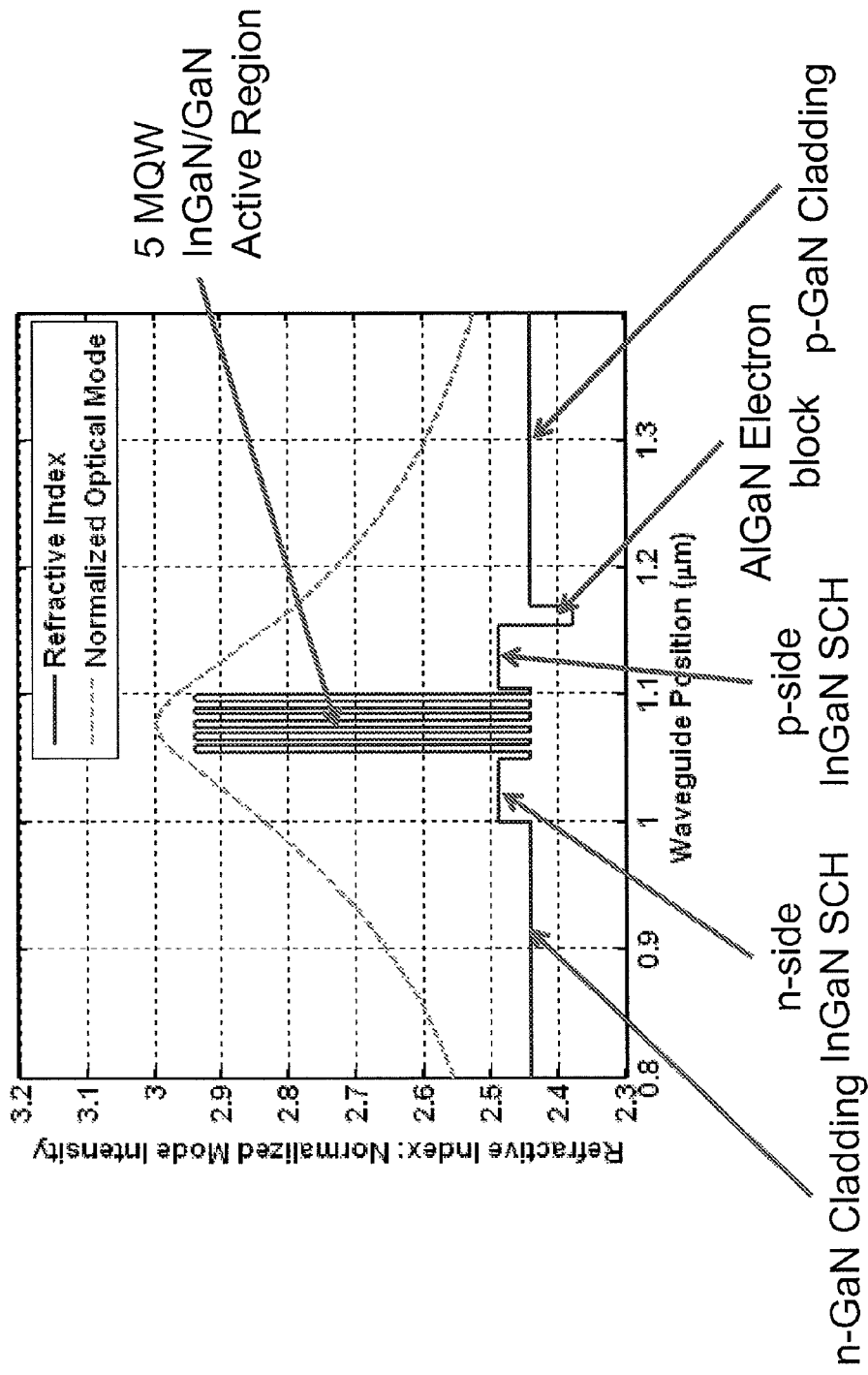
Figure 4: Structure A: Index and Simulated Optical Mode profile

Figure 5: Structure A: Pulsed BA Laser
Results
- 25°C pulsed testing of 1200μm x 30μm laser with 80%/99% facet coatings
- Nonpolar broad area laser
  - 6kA/cm$^2$
  - 474nm
  - >5mW power
- 2$^{nd}$ longest reported λ achieved on NP at time of demo
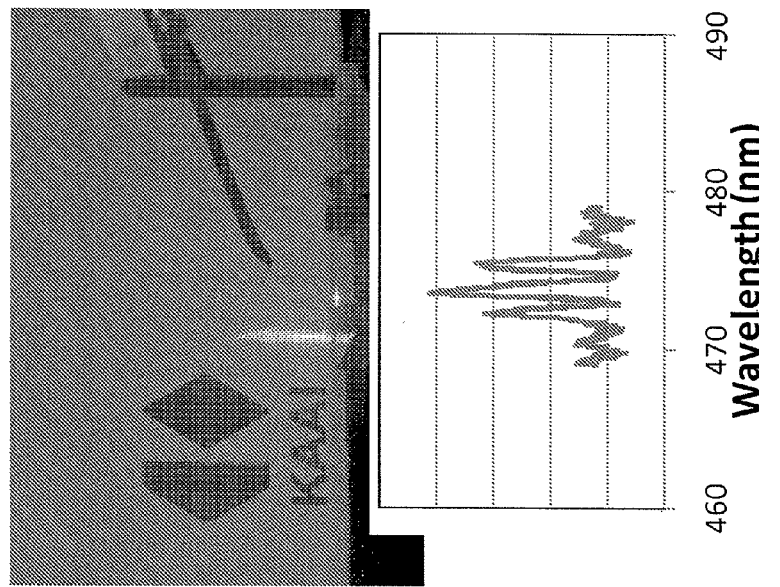

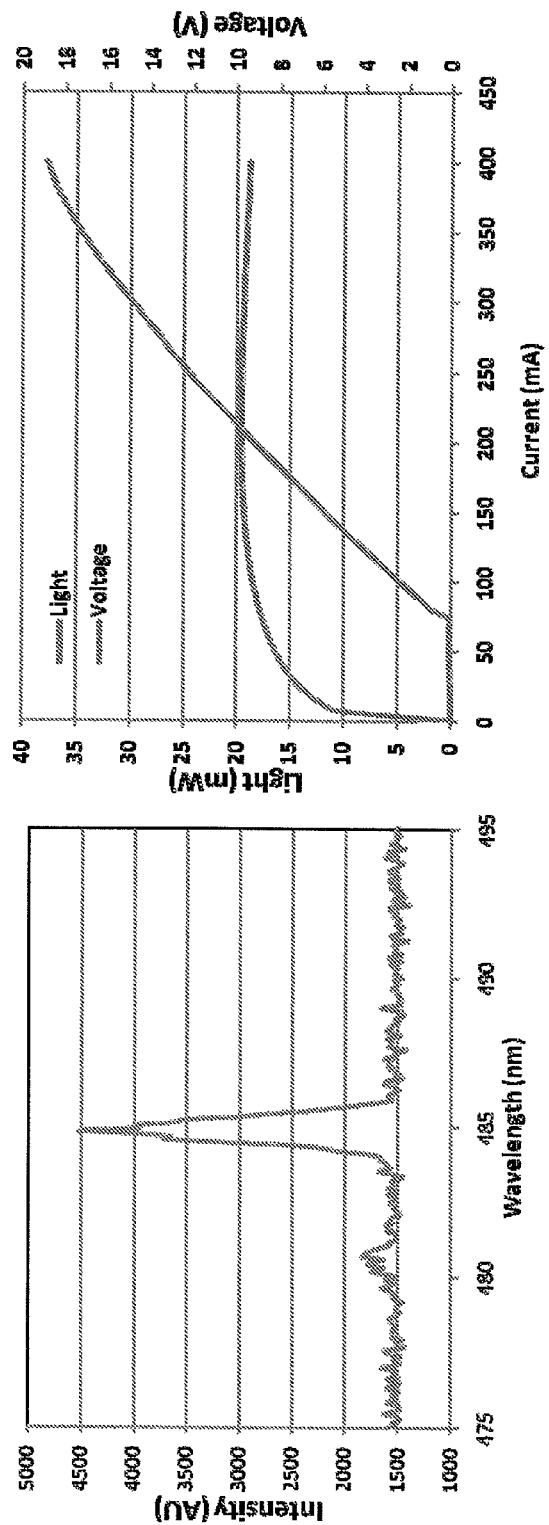
Figure 6: Structure A: CW Ridge LD Result

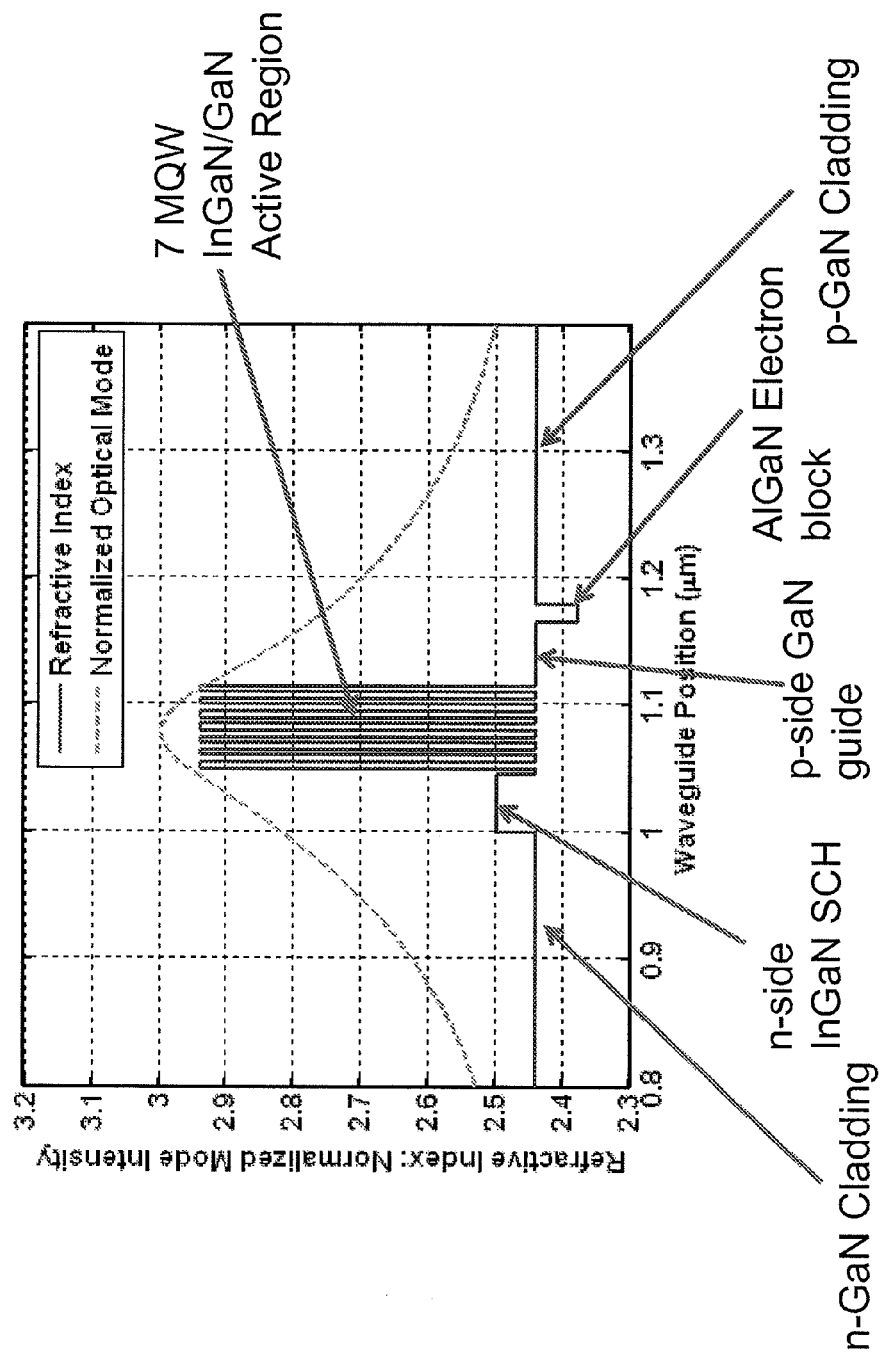
Figure 7: Structure B: Index and Simulated Optical Mode profile

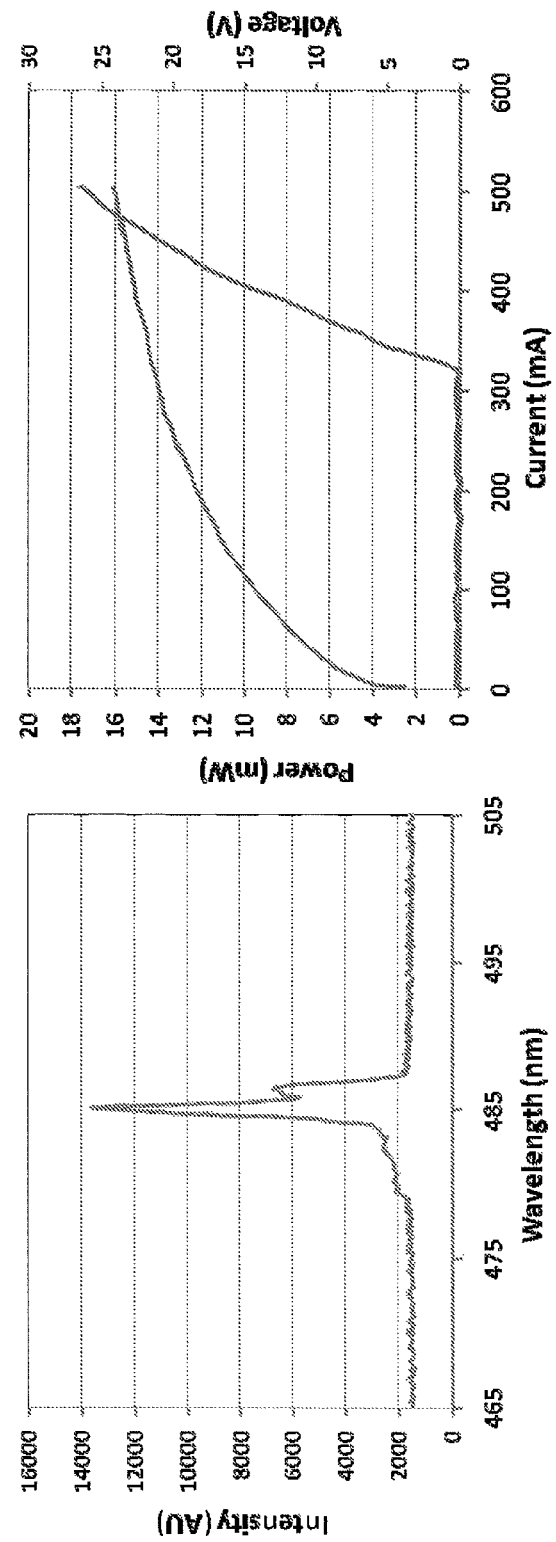
Figure 8: Structure B: Pulsed Ridge LD Results

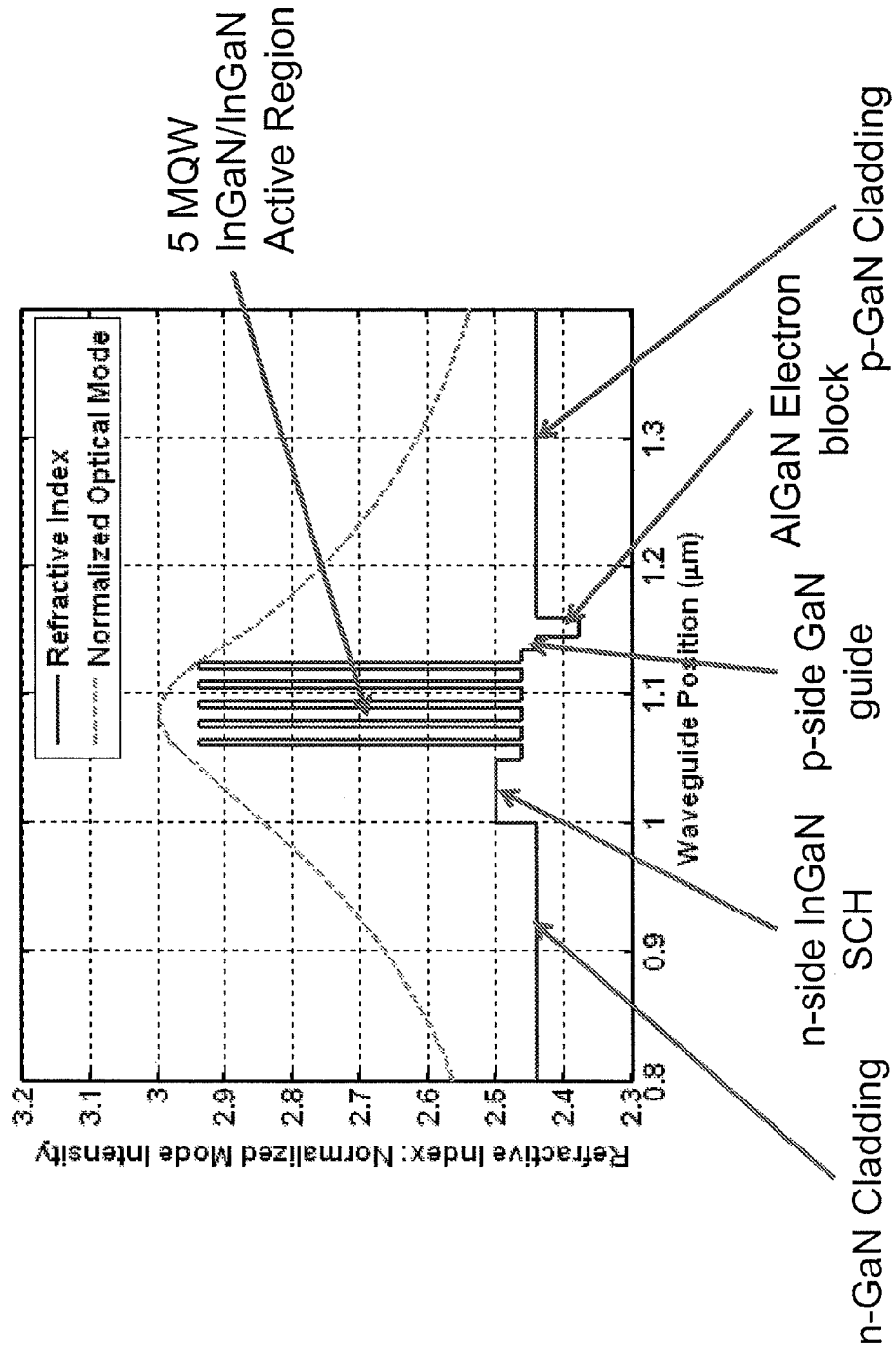
Figure 9: Structure C: Index and Simulated Optical Mode profile

Figure 10: Structure C: CW Ridge LD Results
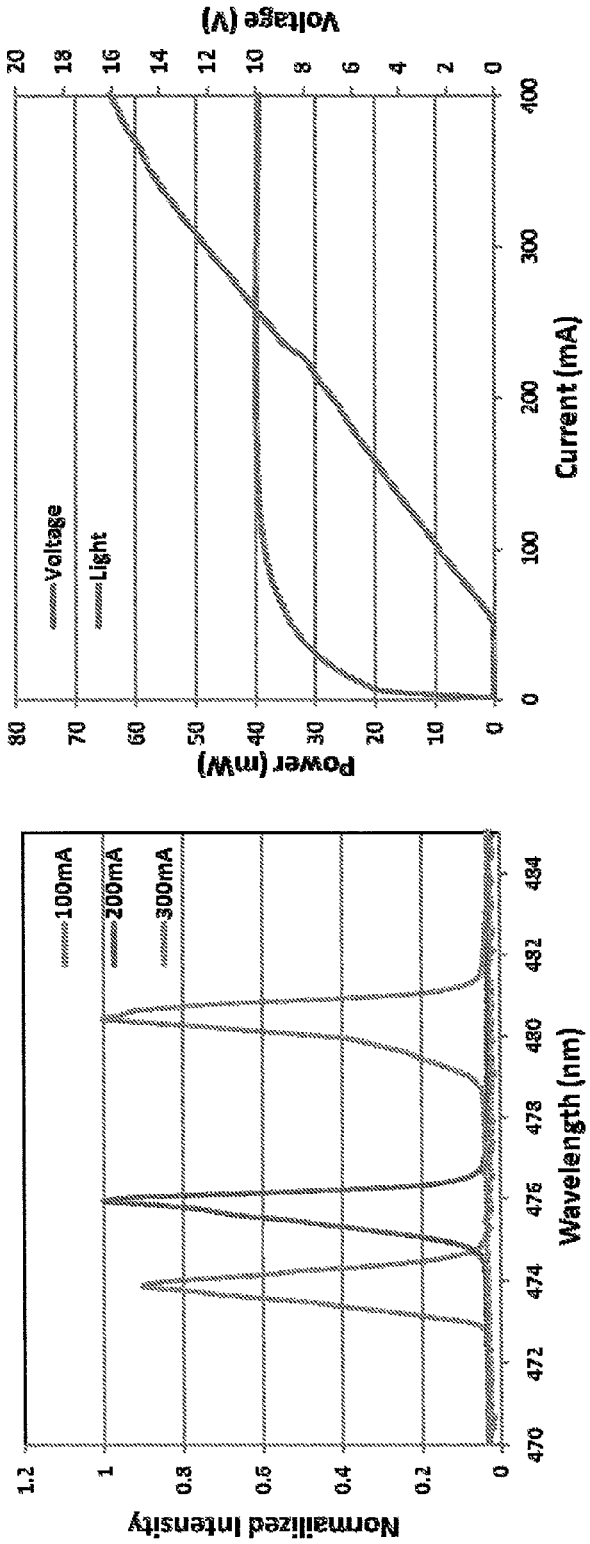
- 25°C continuous wave testing of 1200μm x 1.6μm laser with 80%/99% facet coatings
- Light versus current and voltage
  - Jth ~3.1 kA/cm², Vth ~8.8V
  - +60mW power
- Lasing Spectra
  - Shift from 474nm to 481nm with increased current

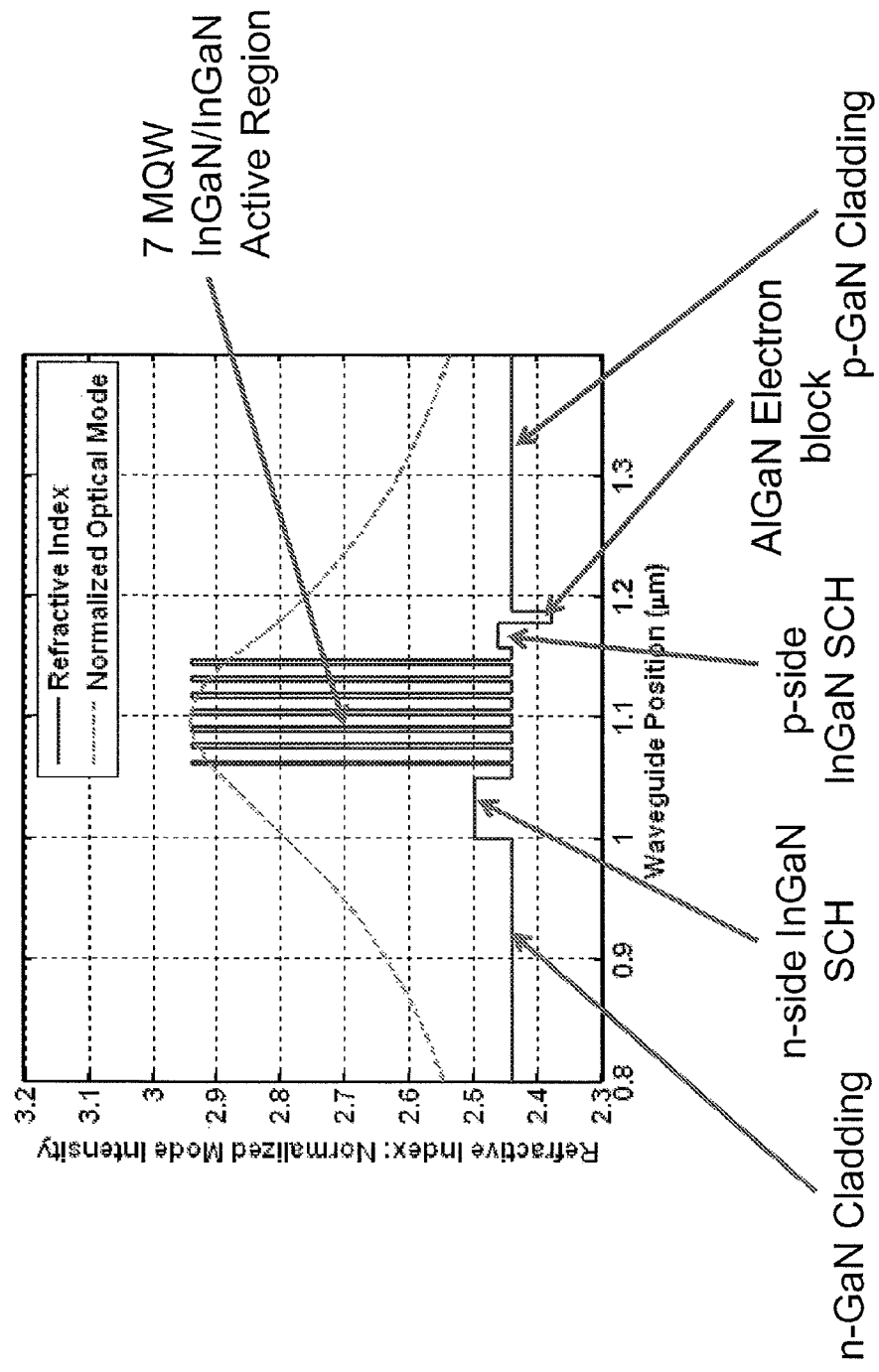
Figure 11: Structure D: Index and Simulated Optical Mode profile

Figure 12: Structure D: CW Ridge LD Results
- 25°C continuous wave testing of 1200μm x 2μm laser with 80%/99% facet coatings
- Light versus current and voltage
  - Jth ~6.6 kA/cm², Vth ~8.1V
  - ~7mW power
- Lasing spectrum
  - 1200μm long ridge LD
  - λpeak→ 498nm
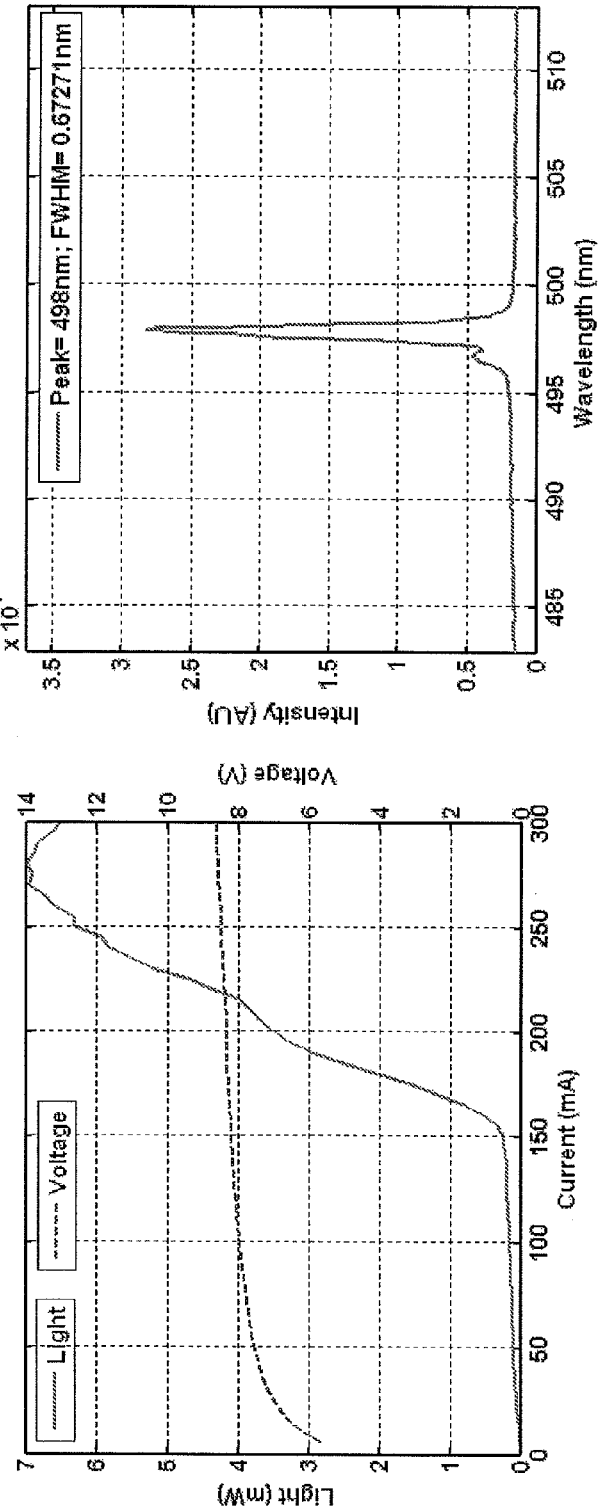

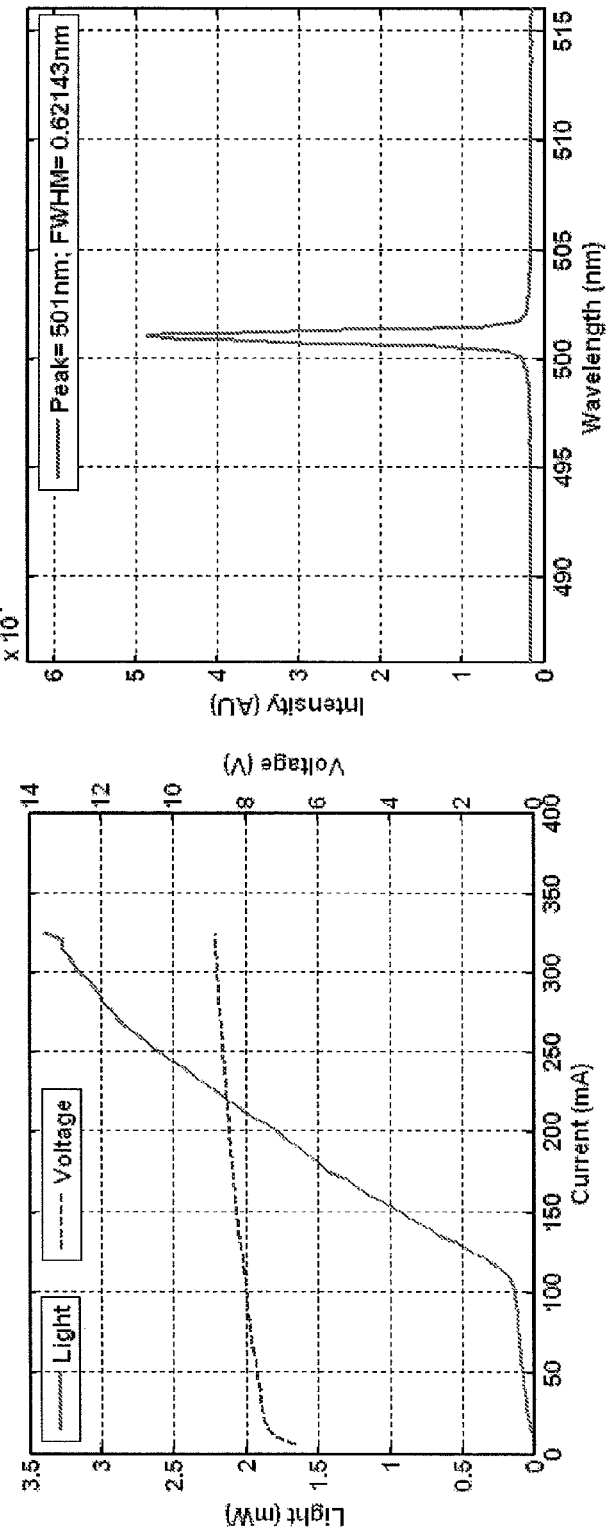
Figure 13: Structure D: CW Ridge LD Results

OPTICAL DEVICE STRUCTURE USING GAN SUBSTRATES AND GROWTH STRUCTURES FOR LASER APPLICATIONS

CROSS-REFERENCE TO RELATED APPLICATIONS

This application claims priority to U.S. Ser. No. 61/170,550, filed Apr. 17, 2009; U.S. Ser. No. 61/170,553, filed Apr. 17, 2009; U.S. Ser. No. 61/177,218, filed May 11, 2009; U.S. Ser. No. 61/243,502, filed Sep. 17, 2009; and U.S. Ser. No. 12/759,273, filed Apr. 13, 2010, each of which is commonly assigned and hereby incorporated by reference.

BACKGROUND OF THE INVENTION

This invention is directed to optical devices and related methods. More particularly, the invention provides a method of manufacture and a device for emitting electromagnetic radiation using semipolar or non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC or DC power source. The conventional light bulb can be found commonly in houses, buildings, and outdoor lightings, and other areas requiring light or displays.

Unfortunately, drawbacks exist with the conventional Edison light bulb. First, the conventional light bulb dissipates much thermal energy. More than 90% of the energy used for the conventional light bulb dissipates as thermal energy. Second, reliability is less than desired—the conventional light bulb routinely fails due to thermal expansion and contraction of the filament element. In addition, conventional light bulbs emit light over a broad spectrum, much of which does not result in illumination at wavelengths of spectral sensitivity to the human eye. Finally, conventional light bulbs emit light in all directions. They therefore are not ideal for applications requiring strong directionality or focus, such as projection displays, optical data storage, or specialized directed lighting.

In 1960, the laser was first demonstrated by Theodore H. Maiman at Hughes Research Laboratories in Malibu. This laser utilized a solid-state flashlamp-pumped synthetic ruby crystal to produce red laser light at 694 nm. By 1964, blue and green laser output was demonstrated by William Bridges at Hughes Aircraft utilizing a gas Argon ion laser. The Ar-ion laser utilized a noble gas as the active medium and produced laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was less than 0.1%. The size, weight, and cost of the laser was undesirable as well.

As laser technology evolved, more efficient lamp pumped solid state laser designs were developed for the red and infrared wavelengths, but these technologies remained a challenge for blue and green lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG). These had wall plug efficiency of ~1%, and were more efficient than Ar-ion gas lasers, but were still too inefficient, large, expensive, and fragile for broad deployment outside of specialty scientific and medical applications. Additionally, the gain crystal used in the solid state lasers typically had energy storage properties which made the lasers difficult to modulate at high speeds, limiting broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%. This sparked further commercialization into specialty industrial, medical, and scientific applications. The change to diode pumping, however, increased the system cost and required precise temperature controls, leaving the laser with substantial size and power consumption. The result did not address the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are intended to provide improved efficiency, cost and size compared to DPSS-SHG lasers, but the specialty diodes and crystals required make this challenging today. Additionally, while the diode-SHG lasers have the benefit of being directly modulated, they suffer from sensitivity to temperature which limits their application.

BRIEF SUMMARY OF THE INVENTION

According to the present invention, techniques related generally to optical devices are provided. More particularly, the present invention provides a method and device for emitting electromagnetic radiation using semipolar or non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In a specific embodiment, the present invention includes an optical device. The optical device includes a gallium nitride substrate member having a semipolar or nonpolar crystalline surface region. The device also has an n-type GaN cladding layer overlying the surface region. Preferably, the n-type GaN cladding layer has a thickness from 100 nm to 3000 nm with a silicon doping level of 5E17 to 5E18 cm-3. The device has an n-side SCH layer overlying the n-type GaN cladding layer. In a preferred embodiment, the n-side SCH layer is comprised of InGaN with molar fraction of indium of between 3% and 5% and having thickness from 50 to 65 nm. The device also has a multiple quantum well active region overlying the n-side SCH layer. In a preferred embodiment, the multiple quantum well active region is comprised of five 4.5-5.5 nm InGaN quantum wells separated by six 4.5-5.5 nm GaN barriers. The optical device has a p-side SCH layer overlying the multiple quantum well active region. In a preferred embodiment, the p-side SCH layer is comprised of InGaN with molar fraction of indium of between 3% and 5% and has a thickness from 50 nm to 65 nm. In a specific embodiment, the optical device has an electron blocking layer overlying the p-side SCH layer. Preferably, the electron blocking layer is comprised of AlGaN with a molar fraction of aluminum of between 15% and 22% and has thickness from 10 nm to 15 nm and doped with magnesium. The optical device has a p-GaN cladding layer overlying the electronic blocking layer according to a specific embodiment. The p-type GaN cladding layer has a thickness from 400 nm to 1000 nm with magnesium doping level of 5E17 cm-3 to 1E19 cm-3. The device has a p++-GaN contact layer with a thickness from 20 nm to 40 nm with a magnesium doping level of 1E20 cm-3 to 1E21 cm-3.

The present invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a semipolar or non-polar gallium nitride material capable of achieve a green laser device, among others. In one or more embodiments, the laser device is capable of emitting long wavelengths such as those ranging from about 470 nm to greater than about 530 nm, but can be others.

This invention provides a method and device for emitting electromagnetic radiation using semipolar gallium or non-polar containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

The invention provides an optical device which includes a gallium nitride substrate member having a semipolar or non-polar crystalline surface region and an n-type gallium nitride region overlying the surface region, the n-type gallium nitride region having a thickness ranging from about 500 nm to 2000 nm. The device also has an active region overlying the n-type gallium nitride region, the active region comprising 3 to 5 or 5 to 7 quantum wells. The device has a laser stripe region formed overlying the active region. In a specific embodiment, the laser stripe region is characterized by a cavity orientation substantially parallel to a first-direction. In a specific embodiment, the laser strip region has a first end and a second end. In a preferred embodiment, the laser stripe region comprises a p-type gallium nitride region and has a thickness ranging from about 500 nm to about 1000 nm. In a specific embodiment, an n-type metal region is overlying a backside of the gallium nitride substrate member. The device also has an overlying p-type metal region overlying an upper portion of the laser stripe.

The present invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a semipolar gallium nitride material capable of achieve a green laser device, among others.

A further understanding of the nature and advantages of the present invention may be realized by reference to the latter portions of the specification and attached drawings.

BRIEF DESCRIPTION OF THE DRAWINGS

FIG. 1A is a simplified perspective view of a laser device fabricated on a semipolar substrate according to an embodiment of the present invention.

FIG. 1B is a simplified perspective view of a laser device fabricated on a non-polar substrate according to an embodiment of the present invention.

FIG. 3 is a simplified diagram illustrating an epitaxial laser structure according to a preferred embodiment of the present invention.

FIGS. 4 through 6 are simplified diagrams illustrating a laser device for a laser device according to a first embodiment of the present invention.

FIGS. 7 through 8 are simplified diagrams illustrating a laser device for a laser device according to a second embodiment of the present invention.

FIGS. 9 through 10 are simplified diagrams illustrating a laser device for a laser device according to a third embodiment of the present invention.

FIGS. 11 through 13 are simplified diagrams illustrating a laser device for a laser device according to a fourth embodiment of the present invention.

DETAILED DESCRIPTION OF THE INVENTION

Figure 2:
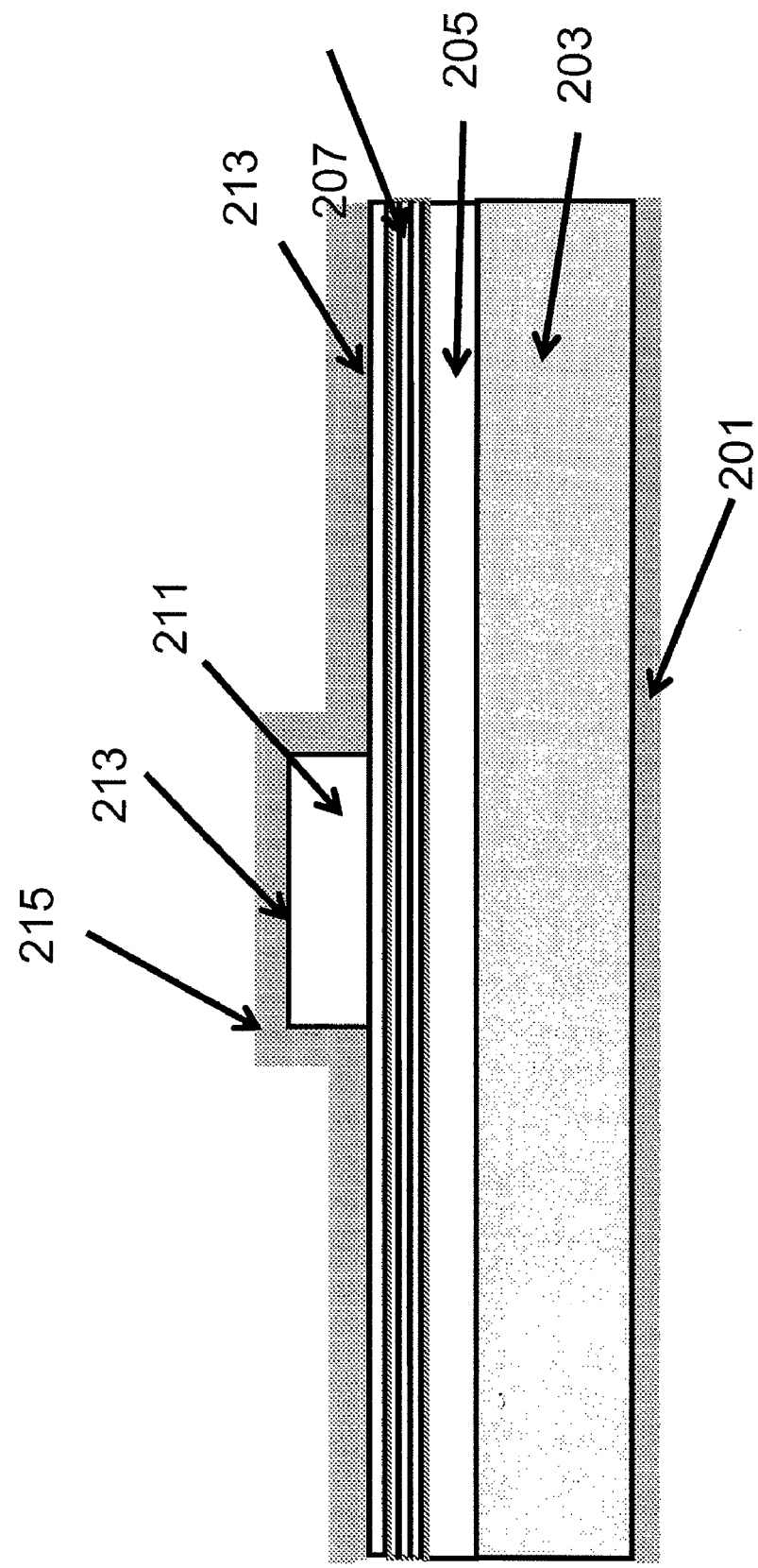
FIG. 2 is a detailed cross-sectional view of a laser device fabricated on a non-polar substrate according to an embodiment of the present invention.

According to the present invention, techniques related generally to optical devices are provided. More particularly, the present invention provides a method and device for emitting electromagnetic radiation using semipolar or non-polar gallium containing substrates such as GaN, MN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices. In a specific embodiment, the present laser device can be employed in either a semipolar or non-polar gallium containing substrate, as described below.

FIG. 1A is a simplified perspective view of a laser device 100 fabricated on a semipolar substrate according to an embodiment of the present invention. This diagram is merely an example, which should not unduly limit the scope of the claims herein. One of ordinary skill in the art would recognize other variations, modifications, and alternatives. As shown, the optical device includes a gallium nitride substrate member 101 having a semipolar or non-polar crystalline surface region. In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density below $10^5$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10^5$ cm$^{-2}$ and about $10^8$ cm$^2$, in a direction that is substantially orthogonal or oblique with respect to the surface. As a consequence of the orthogonal or oblique orientation of the dislocations, the surface dislocation density is below about $10^5$ cm$^{-2}$. In a specific embodiment, the device can be fabricated on a slightly off-cut semipolar substrate as described in U.S. Provisional No. 61/164,409 filed Mar. 28, 2009, commonly assigned, and hereby incorporated by reference herein.

In a specific embodiment on semipolar GaN, the device has a laser stripe region formed overlying a portion of the semi polar crystalline orientation surface region. In a specific semipolar GaN embodiment, the laser stripe region is characterized by a cavity orientation is substantially parallel to the m-direction. In a specific embodiment, the laser strip region has a first end 107 and a second end 109.

In a specific embodiment on nonpolar GaN, the device has a laser stripe region formed overlying a portion of the semi or non-polar crystalline orientation surface region, as illustrated by FIG. 1B, for example. In a specific embodiment, the laser stripe region is characterized by a cavity orientation is substantially parallel to the c-direction. In a specific embodiment, the laser strip region has a first end and a second end. In a specific embodiment, the non-polar crystalline orientation is configured on an m-plane, which leads to polarization ratios parallel to the a-direction. In one or more embodiments, the m-plane is the (10-10) family. Of course, there cavity orientation can also be substantially parallel to the a-direction as well. In the specific nonpolar GaN embodiment having the cavity orientation substantially parallel to the c-direction is further described in "Laser Device and Method Using Slightly Miscut Non-Polar GaN Substrates," in the names of Raring, James W. and Pfister, Nick listed as U.S. Provisional Ser. No. 61/168,926 filed Apr. 13, 2009, commonly assigned, and hereby incorporated by reference for all purposes.

In a preferred semipolar embodiment, the device has a first cleaved m-face facet provided on the first end of the laser stripe region and a second cleaved m-face facet provided on the second end of the laser stripe region. In one or more embodiments, the first cleaved m-facet is substantially parallel with the second cleaved m-facet. In a specific embodiment, the semipolar substrate is configured on (11-22) series of planes, which enables the formation of m-facets for laser cavities oriented in the m-direction. Mirror surfaces are formed on each of the cleaved surfaces. The first cleaved m-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titaniatantalum pentoxidezirconia, including combinations, and the like. Depending upon the embodiment, the first mirror surface can also comprise an anti-reflective coating.

In a preferred nonpolar embodiment, the device has a first cleaved c-face facet provided on the first end of the laser stripe region and a second cleaved c-face facet provided on the second end of the laser stripe region. In one or more embodiments, the first cleaved c-facet is substantially parallel with the second cleaved c-facet. In a specific embodiment, the nonpolar substrate is configured on (10-10) series of planes, which enables the formation of c-facets for laser cavities oriented in the c-direction. Mirror surfaces are formed on each of the cleaved surfaces. The first cleaved c-facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titaniatantalum pentoxidezirconia, including combinations, and the like. Depending upon the embodiment, the first mirror surface can also comprise an anti-reflective coating.

Also in a preferred semipolar embodiment, the second cleaved m-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, and titaniatantalum pentoxidezirconia, combinations, and the like. In a specific embodiment, the second mirror surface comprises an anti-reflective coating.

Also in a preferred nonpolar embodiment, the second cleaved c-facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, and titaniatantalum pentoxidezirconia, combinations, and the like. In a specific embodiment, the second mirror surface comprises an anti-reflective coating.

In a specific embodiment, the laser stripe has a length and width. The length ranges from about 50 microns to about 3000 microns. The strip also has a width ranging from about 0.5 microns to about 50 microns, but can be other dimensions. In a specific embodiment, the width is substantially constant in dimension, although there may be slight variations. The width and length are often formed using a masking and etching process, which are commonly used in the art.

In a specific semipolar embodiment, the device is also characterized by a spontaneously emitted light that is polarized in substantially parallel to the projection of the c-direction. That is, the device performs as a laser or the like. In a preferred embodiment, the spontaneously emitted light is characterized by a polarization ratio of greater than about 0.2 and less than about 1 parallel to the projection of the c-direction. In a preferred embodiment, the spontaneously emitted light characterized by a wavelength ranging from about 500 to about 580 nanometers to yield a green laser and others and the spontaneously emitted light is highly polarized and is characterized by a polarization ratio parallel to the projection of the c-direction of greater than 0.4.

In a specific nonpolar embodiment, the device is also characterized by a spontaneously emitted light that is polarized parallel to the a-direction. That is, the device performs as a laser or the like. In a preferred embodiment, the spontaneously emitted light is characterized by a polarization ratio of greater than about 0.1 and less than about 1 parallel to the projection of the c-direction. In a preferred embodiment, the spontaneously emitted light characterized by a wavelength ranging from about 475 to about 530 nanometers to yield a blue-green or green laser and others and the spontaneously emitted light is highly polarized and is characterized by a polarization ratio parallel to the a-direction of greater than 0.5.

FIG. 2 is a detailed cross-sectional view of a laser device 200 fabricated on a non-polar substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific embodiment, the metal back contact region is made of a suitable material such as those noted below and others.

In a specific embodiment, the device also has an overlying n-type gallium nitride layer 205, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u, v, u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 209. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride, but can be others. The contact region is coupled to an overlying metal layer 215. The overlying metal layer is a multilayered structure containing gold and platinum (Pt/Au), but can be others.

In a specific embodiment, the laser device has active region 207 which can include one to twenty quantum well regions. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 1-20 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where $w<u$, y and/or $x>v$, z so that the bandgap of the well layer(s) is less than that of the barrier layer(s) and the n-type layer. The well layers and barrier layers may each have a thickness between about 1 nm and about 40 nm. In another embodiment, the active layer comprises a double heterostructure, with an InGaN or $Al_wIn_xGa_{1-w-x}N$ layer about 10 nm to 100 nm thick surrounded by GaN or $Al_yIn_zGa_{1-y-z}N$ layers, where $w<u$, y and/or $x>v$, z. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s, t, s+t \leq 1$, with a higher bandgap than the active layer, and may be doped p-type. In other embodiments, the electron blocking layer comprises AlGaN or an AlGaN/GaN super-lattice structure having alternating layers of AlGaN and GaN, each with a thickness between about 0.2 nm and about 5 nm.

As noted, the p-type gallium nitride structure, which can be a p-type doped $Al_qIn_rGa_{1-q-r}N$, where $0 \leq q, r, q+r \leq 1$, layer is deposited above the active layer. The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide.

The metal contact is made of suitable material, for example, silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

FIG. 3 is a simplified diagram illustrating a laser structure according to a preferred embodiment of the present invention. This diagram is merely an example, which should not unduly limit the scope of the claims herein. One of ordinary skill in the art would recognize other variations, modifications, and alternatives. In a specific embodiment, the device includes a starting material such as a bulk nonpolar or semipolar GaN substrate, but can be others. In a specific embodiment, the device is configured to achieve emission wavelength ranges of 390 nm to 420 nm, 420 nm to 440 nm, 440 nm to 470 nm, 470 nm to 490 nm, 490 nm to 510 nm, and 510 nm to 530 nm, but can be others.

In a preferred embodiment, the growth structure is configured using between 3 and 5 or 5 and 7 quantum wells positioned between n-type GaN and p-type GaN cladding layers. In a specific embodiment, the n-type GaN cladding layer ranges in thickness from 500 nm to 2000 nm and has an n-type dopant such as Si with a doping level of between 1E18 cm-3 and 3E18 cm-3. In a specific embodiment, the p-type GaN cladding layer ranges in thickness from 500 nm to 1000 nm and has a p-type dopant such as Mg with a doping level of between 1E17 cm-3 and 5E19 cm-3. In a specific embodiment, the Mg doping level is graded such that the concentration would be lower in the region closer to the quantum wells.

In a specific preferred embodiment, the quantum wells have a thickness of between 3 nm and 5.5 nm or 5.5 nm and 8 nm, but can be others. In a specific embodiment, the quantum wells would be separated by barrier layers with thicknesses between 4 nm and 8 nm or 8 nm and 12 nm. The quantum wells and the barriers together comprise a multiple quantum well (MQW) region.

In a preferred embodiment, the device has barrier layers formed from GaN or InGaN. In a specific embodiment using InGaN, the indium content ranges from 1% to 5% (mole percent), but can be others.

An InGaN separate confinement heterostructure layer (SCH) could be positioned between the n-type GaN cladding and the MQW region according to one or more embodiments. Typically, such separate confinement layer is commonly called the n-side SCH. The n-side SCH layer ranges in thickness from 10 nm to 50 nm or 50 nm to 100 nm and ranges in indium composition from 1% to 7% (mole percent), but can be others. In a specific embodiment, the n-side SCH layer may or may not be doped with an n-type dopant such as Si.

In yet another preferred embodiment, an InGaN separate confinement heterostructure layer (SCH) is positioned between the p-type GaN cladding and the MQW region, which is called the p-side SCH. In a specific embodiment, the p-side SCH layer ranges in thickness from 10 nm to 50 nm or 50 nm to 100 nm and ranges in indium composition from 1% to 7% (mole percent), but can be others. The p-side SCH layer may or may not be doped with a p-type dopant such as Mg. In another embodiment, the structure contains both an n-side SCH and a p-side SCH.

In a specific preferred embodiment, an AlGaN electron blocking layer, with an aluminum content of between 14% and 22% (mole perent), is positioned between the MQW and the p-type GaN cladding layer either within the p-side SCH or between the p-side SCH and the p-type GaN cladding. The AlGaN electron blocking layer ranges in thickness from 10 nm to 20 nm and is doped with a p-type dopant such as Mg from 1E18 cm-3 and 1E20 cm-3 according to a specific embodiment.

Preferably, a p-contact layer positioned on top of and is formed overlying the p-type cladding layer. The p-contact layer would be comprised of GaN doped with a p-dopant such as Mg at a level ranging from 1E20 cm-3 to 1E22 cm-3.

Although the above has been described in terms of specific embodiments, other variations, modifications, and alternatives can exist. The specific embodiments above are not intended to limit the scope of the claims herein. Further examples are provided below.

Embodiment A

In this embodiment, the invention provides a laser device capable of emitting 474 nm and also 485 nm or 470 nm to 490 nm wavelength light, among others. The device is provided with the following elements, as also referenced in FIGS. 4 through 6.

n-GaN cladding layer with a thickness from 100 nm to 3000 nm with Si doping level of 5E17 to 3E18 cm-3 n-side SCH layer comprised of InGaN with molar fraction of indium of between 3% and 5% and thickness from 45 to 65 nm.

Multiple quantum well active region layers comprised of five 4.5-5.5 nm InGaN quantum wells separated by six 4.5-5.5 nm GaN barriers p-side SCH layer comprised of InGaN with molar fraction of indium of between 3% and 5% and thickness from 45 nm to 65 nm Electron blocking layer comprised of AlGaN with molar fraction of aluminum of between 15% and 22% and thickness from 10 nm to 15 nm and doped with Mg p-GaN cladding layer with a thickness from 400 nm to 1000 nm with Mg doping level of 5E17 cm-3 to 1E19 cm-3 p++-GaN contact layer with a thickness from 20 nm to 40 nm with Mg doping level of 1E20 cm-3 to 1E21 cm-3

The above laser device is fabricated on a nonpolar oriented surface region. Preferably, the 474 nm configured laser device uses a nonpolar (10-10) substrate with a miscut or off cut of −0.3 to 0.3 degrees towards (0001) and −0.3 to 0.3 degrees towards (11-20). The n-GaN/p-GaN is grown using an $N_2$ subflow and $N_2$ carrier gas.

Embodiment B

In this embodiment, the invention provides a laser device capable of emitting 486 nm wavelength light, among others, in a ridge laser embodiment. The device is provided with the following elements, as also referenced in FIGS. 8 through 9.

n-GaN cladding layer with a thickness from 100 nm to 3000 nm with Si doping level of 5E17 to 3E18 cm-3 n-side SCH layer comprised of InGaN with molar fraction of indium of between 3% and 5% and thickness from 40 to 60 nm.

Multiple quantum well active region layers comprised of seven 4.5-5.5 nm InGaN quantum wells separated by eight 4.5-5.5 nm GaN barriers p-side guide layer comprised of GaN with a thickness from 40 nm to 50 nm.

Electron blocking layer comprised of AlGaN with molar fraction of aluminum of between 15% and 22% and thickness from 10 nm to 15 nm and doped with Mg.

p-GaN cladding layer with a thickness from 400 nm to 1000 nm with Mg doping level of 5E17 cm-3 to 1E19 cm-3 p++-GaN contact layer with a thickness from 20 nm to 40 nm with Mg doping level of 1E20 cm-3 to 1E21 cm-3

The laser device is fabricated on a non-polar (10-10) oriented surface region (m-plane).

In a preferred embodiment, the non-polar substrate has a miscut or off cut of −0.8 to −1.2 degrees towards (0001) and −0.3 to 0.3 degrees towards (11-20). The non-polar oriented surface region has an overlying n-GaN/p-GaN grown with $H_2/N_2$ subflow and $H_2$ carrier gas.

Embodiment C

In this embodiment, a device structure capable of emitting 481 nm light, among others, is provided in a ridge laser embodiment. The device is provided with the following elements, as referenced in FIGS. 9 through 10.

n-GaN cladding layer with a thickness from 100 nm to 3000 nm with Si doping level of 5E17 to 3E18 cm-3 n-side SCH layer comprised of InGaN with molar fraction of indium of between 4% and 6% and thickness from 45 to 60 nm Multiple quantum well active region layers comprised of five 4.5-5.5 nm InGaN quantum wells separated by four 9.5-10.5 nm InGaN barriers with an indium molar fraction of between 1.5% and 3% p-side guide layer comprised of GaN with molar a thickness from 10 nm to 20 nm.

Electron blocking layer comprised of AlGaN with molar fraction of aluminum of between 15% and 22% and thickness from 10 nm to 15 nm and doped with Mg.

p-GaN cladding layer with a thickness from 400 nm to 1000 nm with Mg doping level of 5E17 cm-3 to 1E19 cm-3 p++-GaN contact layer with a thickness from 20 nm to 40 nm with Mg doping level of 1E20 cm-3 to 1E21 cm-3

The laser device is fabricated on a non-polar oriented surface region (m-plane). The non-polar substrate has a miscut or off cut of –0.8 to –1.2 degrees towards (0001) and –0.3 to 0.3 degrees towards (11-20). The non-polar oriented surface region has an overlying n-GaN/p-GaN grown with $H_2/N_2$ subflow and $H_2$ carrier gas.

Embodiment D

In this embodiment, the invention provides an alternative device structure capable of emitting 501 nm light in a ridge laser embodiment. The device is provided with the following elements, as also referenced in FIGS. 11 through 13.

n-GaN cladding layer with a thickness from 100 nm to 3000 nm with Si doping level of 5E17 to 3E18 cm-3 n-side SCH layer comprised of InGaN with molar fraction of indium of between 3% and 7% and thickness from 40 to 60 nm Multiple quantum well active region layers comprised of seven 3.5-4.5 nm InGaN quantum wells separated by eight 9.5-10.5 nm GaN barriers p-side SCH layer comprised of InGaN with molar a fraction of indium of between 2% and 5% and a thickness from 15 nm to 25 nm.

an electron blocking layer comprised of AlGaN with molar fraction of aluminum of between 15% and 22% and thickness from 10 nm to 15 nm and doped with Mg.

p-GaN cladding layer with a thickness from 400 nm to 1000 nm with Mg doping level of 5E17 cm-3 to 1E19 cm-3 p++-GaN contact layer with a thickness from 20 nm to 40 nm with Mg doping level of 1E20 cm-3 to 1E21 cm-3

The laser device is fabricated on a non-polar (10-10) oriented surface region (m-plane). The non-polar substrate has a miscut or off cut of –0.8 to –1.2 degrees towards (0001) and –0.3 to 0.3 degrees towards (11-20). In a specific embodiment, the non-polar oriented surface region has an overlying n-GaN/p-GaN grown with $H_2/N_2$ subflow and $H_2$ carrier gas. The laser device configured for a 500 nm laser uses well regions and barriers fabricated using slow growth rates of between 0.3 and 0.6 angstroms per second, but can be others. The slow growth rate is believed to maintain the quality of the InGaN at longer wavelengths.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An optical device comprising:
a gallium nitride substrate member having a semipolar or nonpolar crystalline surface region;
an n-type gallium nitride region overlying the surface region, the n-type gallium nitride region having a thickness ranging from about 500 nm to 2000 nm;
an active region overlying the n-type gallium nitride region, the active region comprising 3 to 5 or 5 to 7 quantum wells;
a laser stripe region formed overlying the active region, the laser stripe region being characterized by a cavity orientation substantially parallel to a first-direction, the laser stripe region having a first end and a second end, the laser stripe region comprising a p-type gallium nitride region, the p-type gallium nitride region having a thickness ranging from about 500 nm to about 1000 nm;
an n-type metal region overlying a backside of the gallium nitride substrate member;
an overlying p-type metal region overlying an upper portion of the laser stripe;
a first cleaved m-face facet provided on the first end of the laser stripe region; and
a second cleaved m-face facet provided on the second end of the laser stripe region.

2. The optical device of claim 1 wherein the gallium nitride substrate member has the nonpolar crystalline surface region and the optical device further comprises:
a first cleaved c-face facet provided on the first end of the laser stripe region; and
a second cleaved c-face facet provided on the second end of the laser stripe region.

3. The device of claim 1 wherein the first cleaved m-facet is substantially parallel with the second cleaved m-facet.

4. The device of claim 1 wherein the first cleaved c-facet is substantially parallel with the second cleaved c-facet.

5. The device of claim 1 wherein the first cleaved m-facet comprises a first mirror surface.

6. The device of claim 1 wherein the first cleaved c-facet comprises a first mirror surface.

7. The device of claim 1 wherein the n-type gallium nitride region comprises a silicon entity, the silicon entity having a concentration ranging from about 1E18 cm-3 to about 3E18 cm-3 atoms/cm$^3$.

8. The device of claim 1 wherein the p type gallium nitride region comprises a magnesium entity, the magnesium entity having a concentration ranging from about 1E17 cm-3 and 5E19 cm-3 atoms/cm$^3$.

9. The device of claim 1 wherein the active region comprises a multiple quantum well (MQW) comprising one or more barrier layers.

10. The device of claim 5 further comprising an n-side SCH comprising indium disposed between the MQW and the n-type gallium nitride region, the indium characterized by a mole percent between 2% and 7% and characterized by a thickness from 20 nm to 70 nm.

11. The device of claim 5 further comprising a p-side SCH comprising indium disposed between the MQW and the p-type gallium nitride region, the indium characterized by a mole percent between 2% and 7% and characterized by a thickness from 20 nm to 70 nm.

12. The device of claim 6 further comprising an electron blocking layer comprising aluminum disposed between the MQW and the p-type gallium nitride region, the aluminum being characterized by a mole percent of about 14 to about 22 percent and characterized by a thickness of about 10 nm to about 20 nm.

13. The device of claim 1 wherein the second cleaved m-facet comprises a second mirror surface.

14. The device of claim 1 further comprising a spontaneously emitted light characterized by a wavelength ranging 390 nm to 420 nm, 420 nm to 440 nm, 440 nm to 470 nm, 470 nm to 490 nm, 490 nm to 510 nm, and 510 nm to 530 nm.

15. The device of claim 1 wherein the laser stripe is provided by an etching process selected from dry etching or wet etching.

16. The device of claim 1 wherein the laser stripe comprises an overlying dielectric layer exposing an upper portion of the laser stripe.

17. The device of claim 1 wherein the p-type metal region comprises gallium nitride comprising magnesium entities, the magnesium entities ranging in concentration from about 1E20 cm-3 to 1E22 cm-3.

18. An optical device comprising:
a gallium nitride substrate member having a semipolar or nonpolar crystalline surface region;
an n-type GaN cladding layer overlying the surface region, the n-type GaN cladding layer having a thickness from 100 nm to 3000 nm with a silicon doping level of 5E17 to 5E18 cm-3;
an n-side SCH layer overlying the n-type GaN cladding layer, the n-side SCH layer comprised of InGaN with molar fraction of indium of between 3% and 5% and having thickness from 50 to 65 nm;
a multiple quantum well active region overlying the n-side SCH layer, the multiple quantum well active region comprised of five 4.5 to 5.5 nm InGaN quantum wells separated by six 4.5 to 5.5 nm GaN barriers;
a p-side SCH layer overlying the multiple quantum well active region, the p-side SCH layer comprised of InGaN with a molar fraction of indium of between 3% and 5% and having a thickness from 50 nm to 65 nm;
an electron blocking layer overlying the p-side SCH layer, the electron blocking layer comprised of AlGaN with a molar fraction of aluminum of between 15% and 22% and having a thickness from 10 nm to 15 nm and doped with magnesium;
a p-GaN cladding layer overlying the electronic blocking layer, the p-type GaN cladding layer having a thickness from 400 nm to 1000 nm with a magnesium doping level of 5E17 cm-3 to 1E19 cm-3;
a p++-GaN contact layer with a thickness from 20 nm to 40 nm with a magnesium doping level of 1E20 cm-3 to 1E21 cm-3;
a first cleaved m-face facet provided on the first end of the laser stripe region; and
a second cleaved m-face facet provided on the second end of the laser stripe region.

* * * * *